(12) United States Patent
Tunaboylu et al.

(10) Patent No.: US 7,279,911 B2
(45) Date of Patent: Oct. 9, 2007

(54) PROBE CARD ASSEMBLY WITH DIELECTRIC STRUCTURE

(75) Inventors: Bahadir Tunaboylu, Gilbert, AZ (US); Habib Kilicaslan, Mesa, AZ (US)

(73) Assignee: SV Probe Pte Ltd., Singapore (SG)

( * ) Notice: Subject to any disclaimer, the term of this patent is extended or adjusted under 35 U.S.C. 154(b) by 0 days.

(21) Appl. No.: 11/121,241

(22) Filed: May 3, 2005

(65) Prior Publication Data

US 2006/0250150 A1 Nov. 9, 2006

(51) Int. Cl.
G01R 31/02 (2006.01)
(52) U.S. Cl. .................................... 324/754
(58) Field of Classification Search ............... None
See application file for complete search history.

(56) References Cited

U.S. PATENT DOCUMENTS

| | | | | |
|---|---|---|---|---|
| 4,678,997 A * | 7/1987 | Janes | | 324/341 |
| 5,132,613 A * | 7/1992 | Papae et al. | | 324/754 |
| 5,225,777 A * | 7/1993 | Bross et al. | | 324/754 |
| 5,517,126 A * | 5/1996 | Yamaguchi | | 324/758 |
| 5,525,911 A * | 6/1996 | Marumo et al. | | 324/754 |
| 5,530,371 A * | 6/1996 | Perry et al. | | 324/754 |
| 5,537,676 A * | 7/1996 | Panther | | 455/315 |
| 5,629,630 A | 5/1997 | Thompson et al. | | |
| 5,751,157 A * | 5/1998 | Kister | | 324/758 |
| 6,414,504 B2 * | 7/2002 | Johnston | | 324/761 |
| 6,426,551 B1 * | 7/2002 | Kawakami et al. | | 257/700 |
| 6,853,208 B2 * | 2/2005 | Okubo et al. | | 324/758 |
| 6,894,515 B2 * | 5/2005 | Okano et al. | | 324/754 |
| 2002/0067181 A1 | 6/2002 | Eldridge et al. | | |
| 2003/0016036 A1 | 1/2003 | Ahn et al. | | |
| 2003/0234660 A1 * | 12/2003 | Jain | | 324/765 |
| 2004/0124507 A1 * | 7/2004 | Aldaz | | 257/668 |
| 2005/0035775 A1 * | 2/2005 | Zhou et al. | | 324/754 |

FOREIGN PATENT DOCUMENTS

JP    2000241453 A  *  9/2000

OTHER PUBLICATIONS

International Searching Authority, "Notification of Transmittal of the International Search Report and the Written Opinion of the International Searching Authority, or the Declaration," PCT/US2006/017097, dated Sep. 25, 2006, 5 pages.
Current Claims, PCT/US2006/017097, 4 pages.

* cited by examiner

*Primary Examiner*—Paresh Patel
(74) *Attorney, Agent, or Firm*—Hickman Palermo Truong & Becker LLP; Edward A. Becker

(57) ABSTRACT

A probe card assembly for providing electrical interconnection between a semiconductor device to be tested and a test system is provided. The probe card assembly includes a plurality of probes supported by a support substrate, each of the plurality of probes including an end portion extending away from the support substrate. The end portion is configured to be electrically connected to a semiconductor device to be tested. The probe card assembly also includes a dielectric sheet positioned between the support substrate and the end portion of the plurality of probes such that the probes extend through apertures defined by the dielectric sheet.

10 Claims, 5 Drawing Sheets

PROBE CARD ASSEMBLY WITH DIELECTRIC STRUCTURE

FIELD OF THE INVENTION

The invention relates to probe cards such as those used for testing semiconductor devices and, more particularly to an improved probe card with a dielectric interface for improving power delivery. The invention is also applicable to sockets used to test packages.

BACKGROUND OF THE INVENTION

Probe cards are commonly used in the testing of integrated circuit devices, including memory chips. Certain conventional probe cards have, on one side, an array of metal probes that are arranged to make contact with external electrical contacts, usually in the form of pads or bumps, on the semiconductor device under test. The arrangement of the probes is dictated by the arrangement of the pads or bumps on the device. The probes are typically mounted within a probe head. The opposite ends of the probes may be connected to, for example, a space transformer. One form of space transformer is a multi-layer ceramic structure, in which conductive paths from the probes are routed through and between the layers, emerging on the back side of the space transformer as contact pads that are more widely spaced apart than the probes. Contacts pads may then be connected by telescopic "pogo pins" to a printed circuit board (PCB) that has traces that can be connected to a test circuit. The PCB may also be a multi-layer structure within which the spacing of the electrical paths is further increased.

Within the probe card or probe card assembly there are, thus, a large number of electrical paths located close together and with shapes that are, to a considerable extent, dictated by the problem of physically connecting the paths to the pads on the semiconductor device under test. As a result, significant inductances can arise within and between the electrical paths. These inductances can result in the effective power supply voltage ($V_{cc}$—$V_{GND}$) being appreciably less at the probes than it is on the PCB. If the discrepancy ($V_{DROOP}$) exceeds a certain level (e.g., more than 20%), it can interfere with the testing of the semiconductor devices.

One solution to reducing the effect of the inductances is to decouple the power delivery. This may be done, for example, by placing decoupling capacitors between the power leads on the PCB and on the back side of the space transformer. This is illustrated in FIGS. 1 and 2. Typically, locating decoupling capacitors on the probe side of the space transformer has not been practical due to the close spacing of the probes, and since it is desirable to permit free and uniform movement of the probes as the probe card engages the semiconductor device under test.

Further, conventional approaches using decoupling capacitors typically do not adequately account for inductance problems related to the exposed conductors downstream of the decoupling capacitors (e.g., the conductors in the space transformer, the conductive probes themselves extending from a probe head, etc.). Thus, it would be desirable to provide an improved apparatus and method for reducing undesirable inductance in connection with a probe card assembly.

SUMMARY OF THE INVENTION

According to an exemplary embodiment of the present invention, a probe card assembly for providing electrical interconnection between a semiconductor device to be tested and a test system is provided. The probe card assembly includes a plurality of probes supported by a support substrate, each of the plurality of probes including an end portion extending away from the support substrate. The end portion is configured to be electrically connected to a semiconductor device to be tested. The probe card assembly also includes a dielectric sheet positioned between the support substrate and the end portion of the plurality of probes such that the probes extend through apertures defined by the dielectric sheet.

According to another exemplary embodiment of the present invention, another probe card assembly for providing electrical interconnection between a semiconductor device to be tested and a test system is provided. The probe card assembly includes a plurality of probes supported by a support substrate, each of the plurality of probes including an end portion extending away from the support substrate. The end portion is configured to be electrically connected to a semiconductor device to be tested. The probe card assembly also includes a dielectric strip coupled to a side of at least a portion of the plurality of probes at a position on the probes between the support substrate and the end portion of the probes.

The basic aspects of the present invention may be combined in a number of forms. The preferred aspects of the various constructions may be used in conjunction with one another or used alone. The various features provide certain advantages over the prior art. These advantages will be described herein and will be understood by those skilled in the art upon reviewing the description and drawings.

BRIEF DESCRIPTION OF THE DRAWINGS

For the purpose of illustrating the invention, there are shown in the drawings forms of the invention which are presently preferred; it being understood, however, that this invention is not limited to the precise arrangements and instrumentalities shown.

DETAILED DESCRIPTION OF THE DRAWINGS

As used herein, the terms "probe," "probe pin," and "probe element" refer to a contact element configured to contact a semiconductor device to be tested. Exemplary probes include wire bonded contact elements, pick and place type contact elements, plated-up contact elements, and any of a number of other contact element structures configured to contact a semiconductor device to be tested (e.g., through contact pads or the like on the semiconductor device). The probes may be of monolithic construction, may be plated with a coating (e.g., a gold coating over all or a portion of the probe), or may be constructed of multiple materials or components (e.g., a layered construction, a construction including an affixed tip structure, etc).

As used herein, the term "support substrate" refers to any of a number of structures configured to support the probes which are configured to extend toward and contact a semiconductor device to be tested. For example, the support substrate may be a multi-layer ceramic substrate, a polyimide substrate, or any of a number of other types of substrates. For example, the support substrate may be a space transformer.

Figure 1:
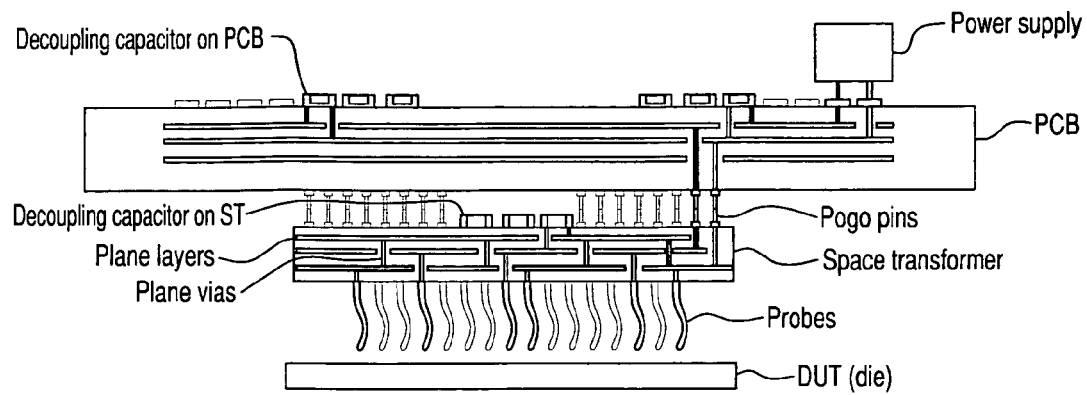
FIG. 1 is a schematic representation of a conventional probe card assembly.
Figure 2:
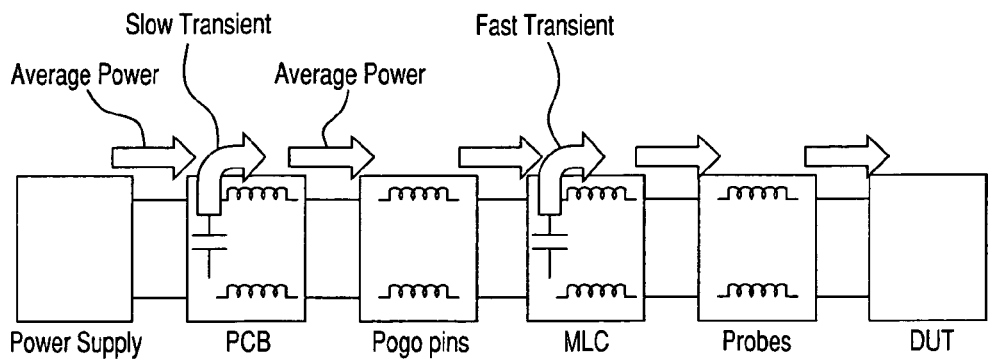
FIG. 2 is a power flow diagram of a conventional probe card assembly.
Figure 3:
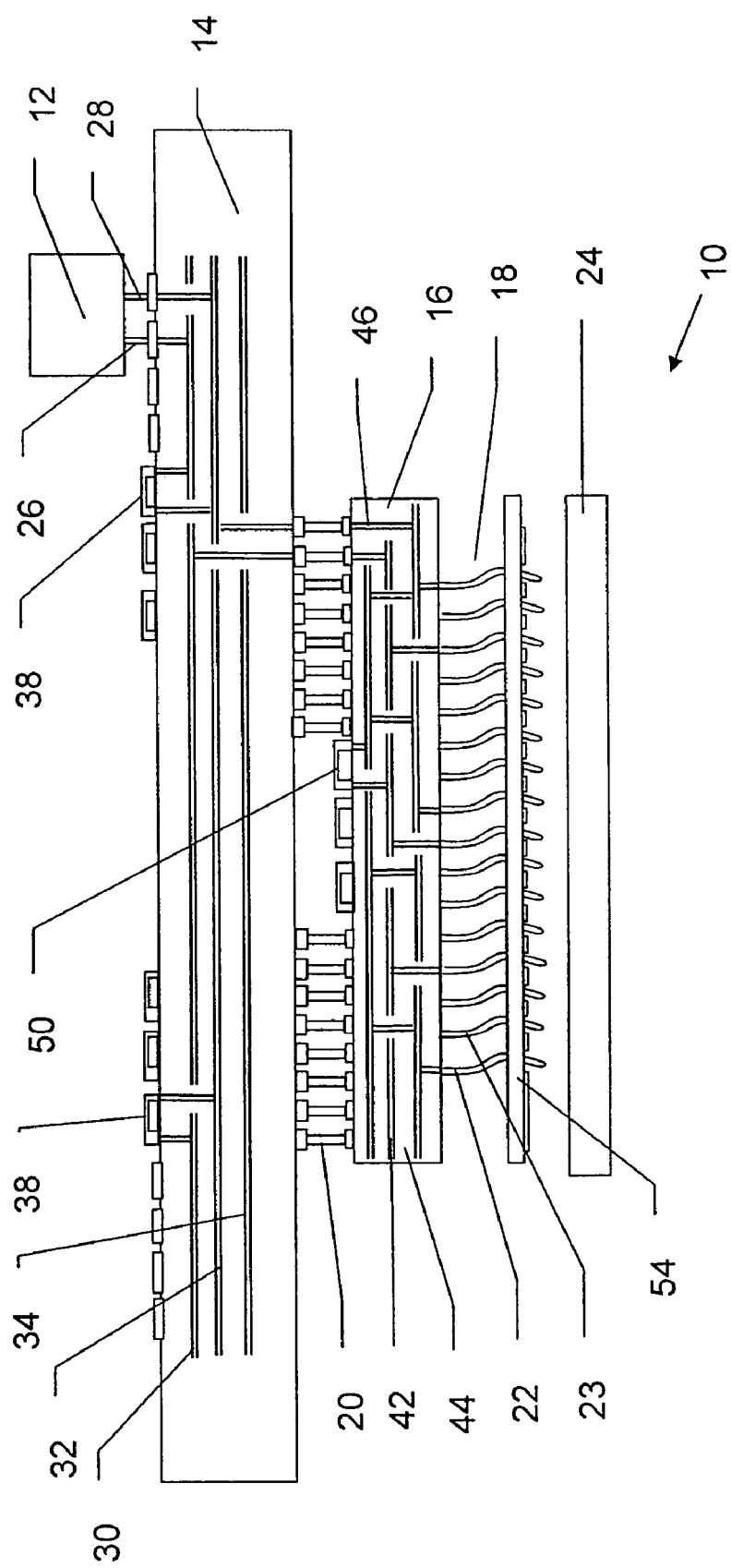
FIG. 3 is a schematic view of a portion of a probe card assembly in accordance with an exemplary embodiment of the present invention.
Figure 4:
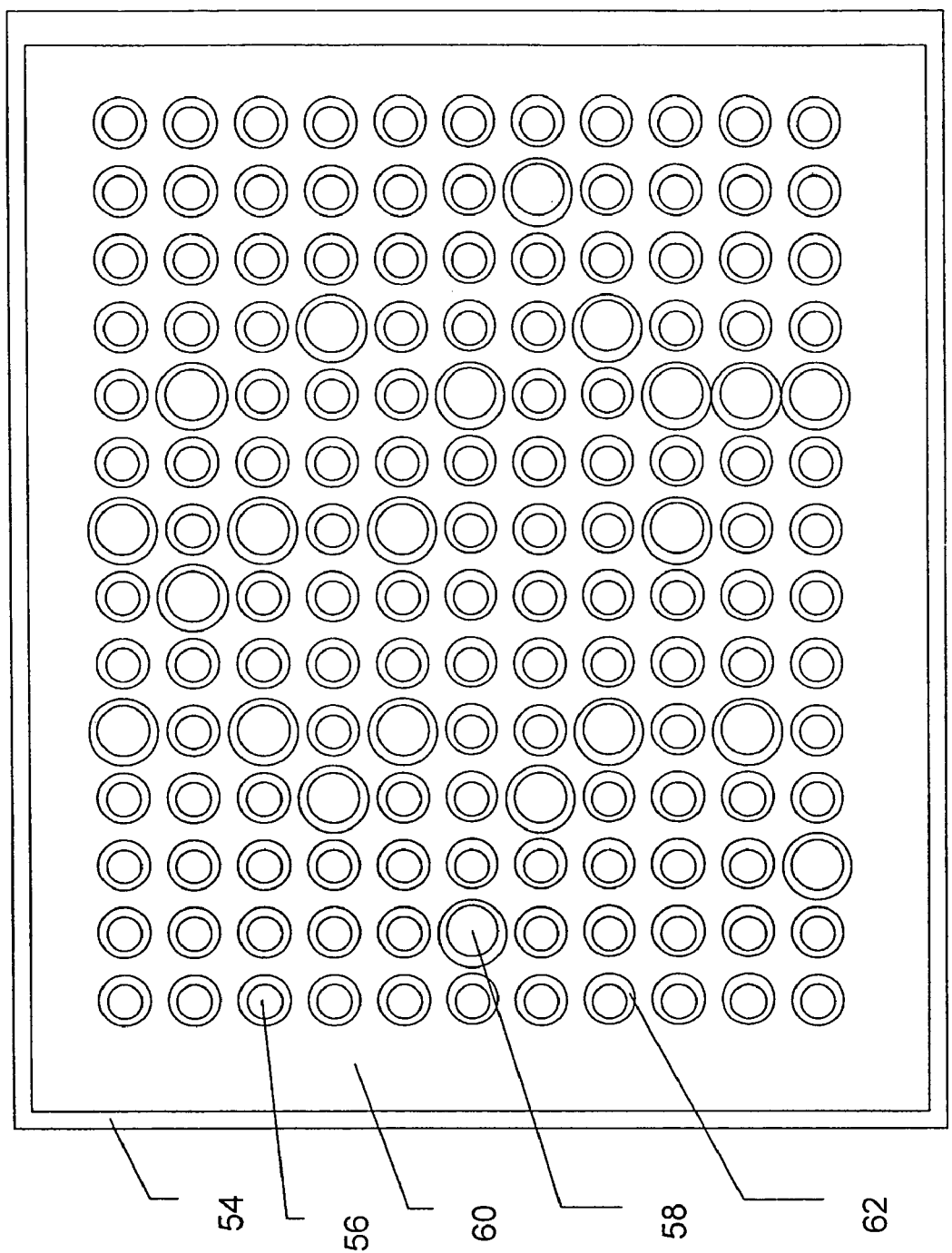
FIG. 4 is a plan view of a template forming part of the probe card assembly shown in FIG. 3.
Figure 5:
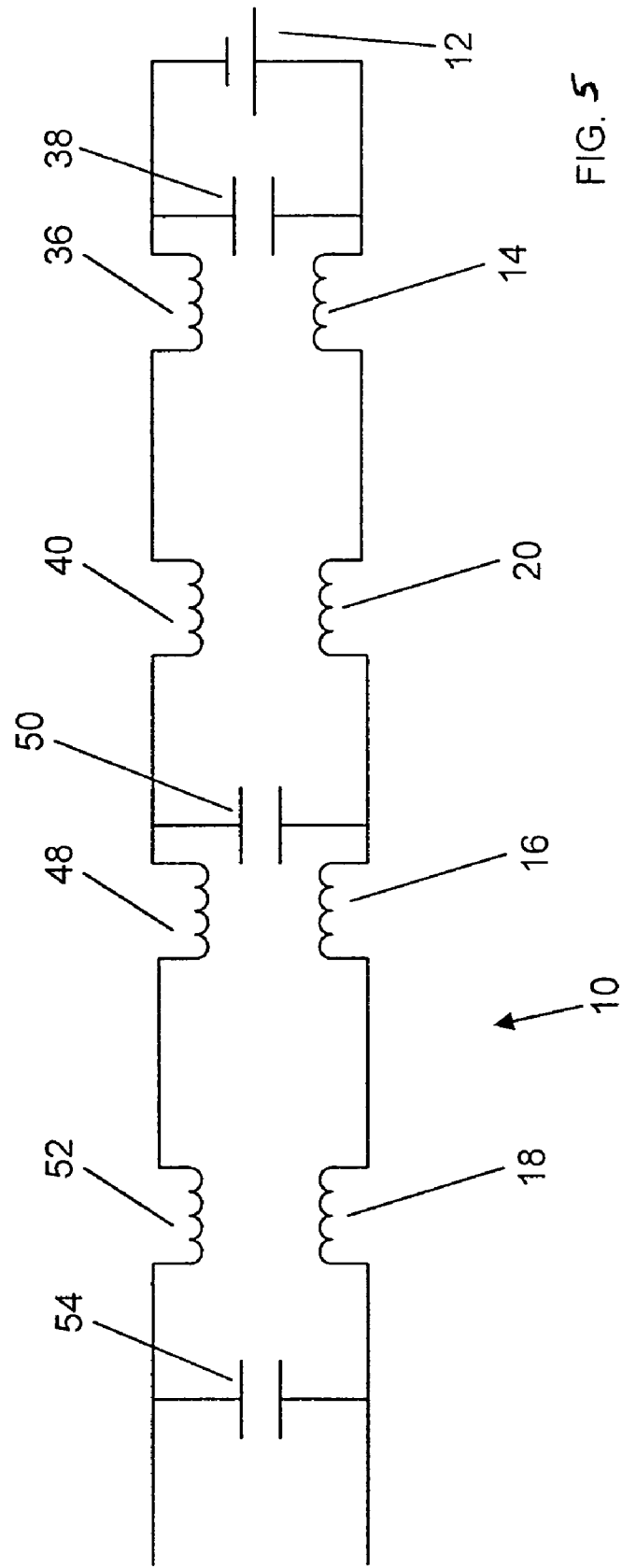
FIG. 5 is a schematic circuit diagram illustrating aspects of the operation of the probe card assembly shown in FIG. 3.

Referring to the drawings, wherein like reference numerals identify similar elements in the various figures, there is shown in FIGS. 3-5 one embodiment of a probe card assembly or probe card according to the present invention, indicated generally by the reference numeral 10. The exemplary probe card assembly 10 includes a power supply 12, a printed circuit board (PCB) 14, a space transformer 16, and a probe head 18. The PCB 14 may be connected to the space transformer 16 by an array of pogo pins 20.

The probe head 18 includes a large number of probe pins that, in use of the probe card assembly 10, are intended to engage external pads, bumps, or other electrical contacts on an integrated circuit (IC) device 24 that is to be tested. It is contemplated that the present invention is applicable to the testing of integrated circuit devices in a number of forms, including but not limited to integrated circuit devices on a wafer (i.e., prior to singulation from the wafer) and integrated circuit devices after singulation from a wafer (e.g., packaged integrated circuit devices). The probe pins comprise power probe pins 22 (including ground probe pins that are used by the circuits supplying power to the device 24 under test) and signal probe pins 23. The probe pins 22, 23 may be curved into a slight S-shape so as to provide a degree of flexibility in the vertical direction. When the probe test assembly 10 is brought into engagement with a device 24, the probe pins 22, 23 flex resiliently so as to result in the application of a contact force on the pads of the device 24, while at the same time providing vertical displacement to accommodate slight departures from planarity (e.g., departures from planarity related to device 24, probe card assembly 10, the contact location on the device to be tested, etc.). To avoid the probe pins 22, 23 touching each other as they flex, they may have the same shape and be provided in the same orientation.

In the probe card assembly 10 shown in FIG. 3, live and ground power leads 26, 28 from the power supply 12 are connected to live and ground power tracks 30, 32 within the PCB 14. The PCB 14 also has signal tracks 34. As discussed above, the arrangement of the tracks can result in appreciable inductances 36 (see FIG. 5) arising between the power tracks. To compensate for the inductances, decoupling capacitors 38 (see FIGS. 3 and 5) are provided between the live power tracks 30 and the ground power tracks 32 on the PCB 14. The decoupling capacitors 38 serve to reduce the effect of the inductances 36 and to improve the slow transient power supply to the device 24 under test. As described herein, the phrase "slow transient" refers to load changes in a probe card that, if any voltage correction is desired, a power supply can correct with a feedback loop. Time periods which are considered "slow" may differ from system-to-system depending on the power supply feedback loop bandwidth. However, generally, load changes that occur over about a microsecond time frame are considered slow transients, whereas load changes that occur over a nanosecond time frame are currently considered fast transients.

In the illustrated embodiment, the tracks 30, 32, 34 are connected electrically to the pogo pins 20, which are electrically connected to the space transformer 16. The pogo pins 20, because they are close together, may also produce inductances 40 (See FIG. 5).

The exemplary space transformer 16 is illustrated as a multi-layer ceramic structure, with conductive paths formed by tracks 42 between the layers 44 and vias 46 through the layers. The paths 42, 46 serve to connect the pogo pins 20 with the probe pins 22, 23. The pogo pins 20 are typically more widely spaced than the probe pins 22, 23, and may be in a different pattern or arrangement. In addition, there may be several power probe pins 22 if, for example, the device 24 under test is a wafer containing several independent integrated circuits. The paths 42, 46 within the space transformer 16 may then connect several power probe pins 22 to a single pair of power pogo pins 20. As a result, the internal configuration of the space transformer 16 may, for example, be somewhat complicated, and inductances 48 within the space transformer may be significant.

Decoupling capacitors 50 are provided on the face of the space transformer 16 towards the PCB 14. These capacitors compensate to some extent for inductances in the pogo pins 20 and in the space transformer 16, and improve the fast transient power supply to the device 24 under test. However, because of their location, the capacitors 50 may not compensate well for inductance that is generated by the paths 42, 46 within the space transformer.

The power probe pins 22 also have inductances 52, for which the capacitors 50 may not effectively compensate. The probe pins also have capacitances, however, those capacitances are typically not sufficiently large to compensate for the inductances 52. In order to address the capacitances described above, the probe card assembly 10 is provided with a template 54 which defines holes/apertures through which the probe pins 22, 23 extend. As shown in FIG. 4, the template 54 consists of a sheet of material of high dielectric coefficient. Exemplary materials include, for example, niobium oxide, a polyimide liquid crystal polymer, a member of the barium titanate family (e.g., BaSrTiO3 having a dielectric constant of approximately 300), a ceramic such as PbLaZrTiO3 (having a dielectric constant of greater than 2500), etc. The thickness will be adjusted to provide the desired capacitance level, but should not exceed the probe height nor obstruct the probe operation (e.g., flexing during contact).

As shown in FIG. 4, the template 54 defines holes 56 for power probe pins 22 and holes 58 for signal probe pins 23. The holes 56 for power probe pins 22 are preferably configured to be large enough that the power probe pins are not restrained when the probe pins are unloaded, but small enough such that the lateral deflection (buckling) of the power probe pins when the probe test assembly 10 engages a device 24 under test will cause the pins to contact the sides of the holes 56. The holes 58 for signal probe pins 23 are preferably formed larger than the holes 56, such that the signal probe pins do not contact the rims of the holes 58 under load. The high dielectric coefficient material of the template 54 establishes a substantial capacitance between the power probe pins 22, while the larger holes 58 provide an air gap that isolates the signal probe pins 23, thereby preventing undesired capacitive coupling between the power probe pins 22 and the signal probe pins 23. The template is preferably located as close as possible to probe tips in order to reduce the inductance affect up to that point. Potential factors influencing the location of the template relative to the probe tips include (1) the planarity of the probe tips and (2) debris accumulation that could result in damage to the probes. Since the probes will flex in approximately the same direction and in approximately the same amount laterally, the dielectric template may also move the same amount. If there are discrepancies in probe planarity, the dielectric template can, potentially, absorb or inhibit some of the unequal probe flexing, depending on the template location along the probe length.

In the embodiment shown in FIG. 4, the template 54 has a layer of metallization 60, which covers one surface except for annular spaces 62 around the holes 56, 58. The metallization layer 60 (e.g., Cu, Au, Nickel, alloys thereof, etc.) is preferably disposed on the surface of the template 54 configured to be adjacent a semiconductor device to be tested. The metallization layer may be applied, for example, through a plating process, where the annular spaces may be etched away after such a plating process, or masked during the plating process. The annular spaces 62 around the holes 56 for power probe pins 22 define capacitors of known, controllable capacitance between the power probe pins 22 and the metallization 60. The metallization 60 electrically connects the capacitors formed by the annular spaces 62 around different power probe pins 22, thus providing a controllable capacitance between the power probe pins. The annular spaces 62 around the holes, including the holes 58 for signal probe pins 23, also serve to guard against electrical contact between the probe pins and the metallization 60.

It is also contemplated that a metallic material may be applied to a portion of the surface of the template in configurations other than a full layer. For example, depending upon the desired electrical (e.g., capacitive, inductive, etc.) effect, the metallic material may selectively be applied as strips on the template, in specific regions of the template, etc.

The position of the template 54, close to the tips of the probe pins 22, makes possible a high level of decoupling not only of inductances in the space transformer 16 but also of inductances in the probe pins 22 themselves, and improves the very fast transient power supply to the device 24 under test.

The invention herein has been described and illustrated with respect to certain exemplary embodiments. It should be understood by those skilled in the art that the foregoing and various other changes, omissions and additions may be made therein and thereto, without departing from the spirit and scope of the present invention.

For example, although an embodiment has been described that uses a space transformer 16, if the spacing of the contact pads on the device 24 being tested is sufficiently wide, for example in the case of a test socket for a packaged or partially packaged IC device, the space transformer may be omitted. Also, while an embodiment has been described that uses pogo pins 20, other forms of interconnection, such as an interposer, may be used instead.

It will be understood by those skilled in the art that the actual pattern of power tracks 30, 32 and signal tracks 34 and tracks 44 is typically considerably more complicated than is shown symbolically in FIG. 3.

Although in FIG. 4 the annular spaces 62 are shown as substantially uniform, they could be varied. For example, the annular spaces 62 around different holes 56 could be of different widths, to provide different capacitances for different power probe pins 22. For example, if the direction of bending of the probe pins 22, 23 is known, then the annular spaces need not be uniform since the capacitance is determined largely by the width of the annular space 62 at the side toward which the power probe pin 22 bends in use. Thus, the location of the remainder of the metallization edges of the space 62 may be set largely by manufacturing convenience. It is also not necessary for either the holes 56, 58 in the dielectric template 54 or the spaces in the metallization 60 to be circular, especially if the holes are formed by a process other than drilling.

Although in FIG. 4 the dielectric template 54 is shown with a rectangular array of holes 54, and 56, the holes 54, 56 may be in a different pattern, depending on the arrangement of probe pins 22, 23 on a particular probe card 10, which may in turn be dependent on the arrangement of the contact pads on the device 24 under test.

It should be readily apparent that there is no need for separate holes 58 for each of signal probe pins 23. Instead, it may be desirable to form an enlarged opening in the template through which multiple signal pins pass.

The dielectric template of the present invention may be secured directly to the probes of the probe card assembly (e.g., using an adhesive, heat, pressing, or any of a number of other methods) as shown in FIG. 3. Alternatively, the dielectric template may be secured to another structure located between the probe substrate (e.g., a space transformer) and the probe tips. For example, such a structure may be a polymer film (e.g., a polyimide film, LCP with defined metal capacitor traces) attached to a lower die of a probe head.

Figure 6A:
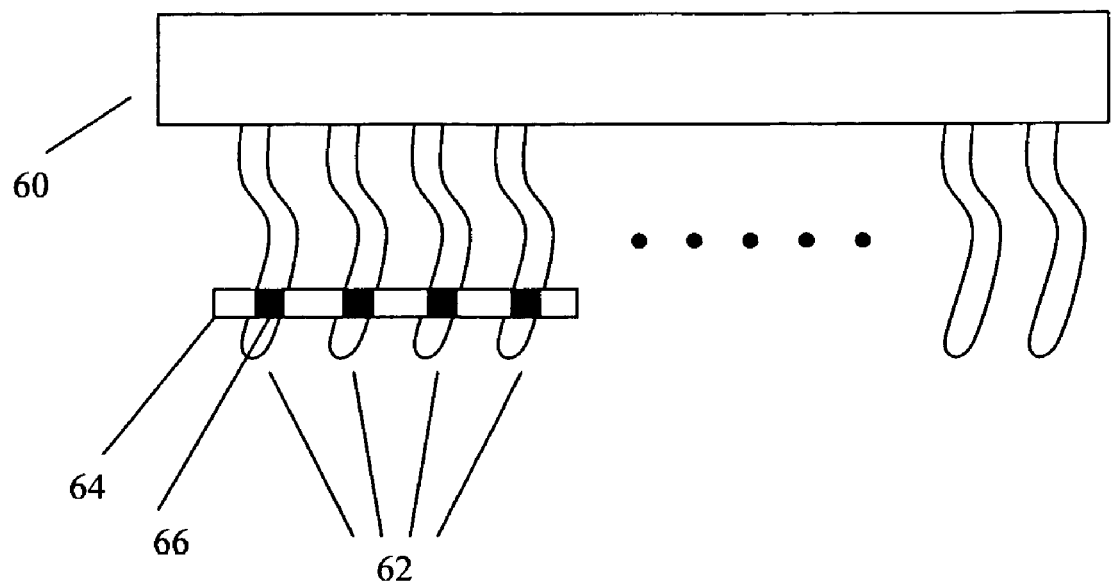
FIG. 6A is a side view of a portion of a probe card assembly in accordance with an exemplary embodiment of the present invention.
Figure 6B:
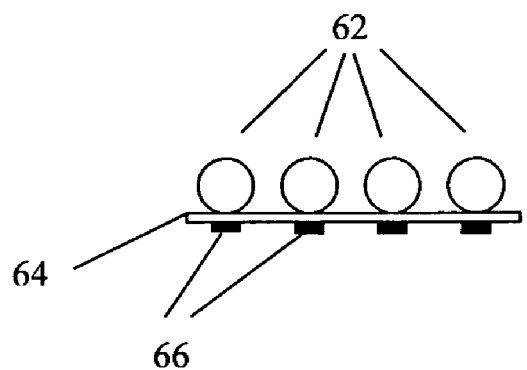
FIG. 6B is a top view of a portion of the structure of FIG. 6A.

According to another exemplary embodiment of the present invention, a dielectric template is not employed as in FIGS. 3-4. Rather, a strip of dielectric material may be directly applied to a row or column of probes. For example, such a strip may be applied to the probes using an adhesive (e.g., similar to the application of a strip of tape), through the application of heat, etc. FIGS. 6A-B illustrate an exemplary embodiment of such a configuration.

FIG. 6A is a side view of a portion of a probe card assembly including probe substrate 60 (e.g., a space transformer, PCB, etc.) and a plurality of probes 62 (where the probes may have a number of configurations including square, rectangular or round cross sections) extending therefrom. Dielectric strip 64 is applied across a portion of probes 60. For example, dielectric strip 64 may be applied across only the power probes (including ground probes), so that the signal probes do not contact dielectric strip 64. In the exemplary embodiment of the present invention shown in FIG. 6A, metallic contacts 66 are applied to (or integrated as part of ) the surface of dielectric strip 64 opposite probes 62 (i.e., the metallic contacts are not intended to be in contact with the probes in this embodiment, but they may be in another embodiment of the present invention). This is made further clear in FIG. 6B, which is a top view of a portion of the structure of FIG. 6B (with probe substrate 60 and other probes omitted for simplicity). In certain embodiments of the present invention, a metallic material may be disposed in a continuous length along the surface of the dielectric strip as opposed to piecemeal contacts 66 as illustrated.

As the desired design of a given probe card assembly may dictate, a number of dielectric strips such as that illustrated in FIGS. 6A-B may be included in the probe card assembly.

The dielectric constant of the dielectric template described herein, as well as the dielectric strip described in connection with FIGS. 6A-B, has a suitable dielectric constant of at least 10, and preferably at least 100.

The present invention may be embodied in other specific forms without departing from the spirit or essential attributes thereof and, accordingly, reference should be made to the appended claims, rather than to the foregoing specification, as indicating the scope of the invention.

What is claimed is:

1. A probe card assembly for providing electrical interconnection between a semiconductor device to be tested and a test system, the probe card assembly comprising:
   a plurality of probes supported by a support substrate, each of the plurality of probes including an end portion extending away from the support substrate, the end portion being configured to be electrically connected to a semiconductor device to be tested;
   a dielectric sheet positioned between the support substrate and the end portion of the plurality of probes such that the probes extend through apertures defined by the dielectric sheet, wherein one or more of the apertures are dimensioned such that one or more of the plurality of probes extend through and do not contact the dielectric sheet adjacent a respective aperture when the probe card assembly is in a test position with respect to the semiconductor device to be tested; and
   an electrically conductive layer disposed on the dielectric sheet, the electrically conductive layer being spaced from the apertures.

2. The probe card assembly according to claim 1, wherein the plurality of probes comprise signal probes and power probes, and wherein the apertures through which one or more of the power probes extend are dimensioned such that the one or more power probes contact the dielectric sheet adjacent a respective aperture when the probe card assembly is in a test position with respect to the semiconductor device to be tested.

3. The probe card assembly according to claim 1, wherein the plurality of probes comprise signal probes and power probes, and wherein the apertures through which one or more of the signal probes extend are dimensioned such that the one or more signal probes do not contact the dielectric sheet adjacent a respective aperture when the probe card assembly is in a test position with respect to the semiconductor device to be tested.

4. The probe card assembly according to claim 1, wherein the electrically conductive layer covers only specified portions of the dielectric sheet.

5. The probe card assembly according to claim 1, wherein the electrically conductive layer is disposed on a side of the dielectric sheet configured to be adjacent the semiconductor device to be tested.

6. The probe card assembly according to claim 1, wherein the plurality of probes comprise signal probes and power probes, wherein the apertures through which one or more of the power probes extend are dimensioned such that the one or more power probes contact the dielectric sheet adjacent a respective aperture when the probe card assembly is in a test position with respect to the semiconductor device to be tested, and wherein the apertures through which one or more of the signal probes extend are dimensioned such that the one or more signal probes do not contact the dielectric sheet adjacent a respective aperture when the probe card assembly is in the test position.

7. The probe card assembly according to claim 6, wherein the electrically conductive layer is spaced from the apertures such that the power probes do not contact the electrically conductive layer when the probe card assembly is in the test position.

8. The probe card assembly according to claim 1, wherein the dielectric sheet has a dielectric coefficient of at least about 10.

9. The probe card assembly of claim 1, wherein the dielectric sheet has a dielectric constant of at least about 100.

10. The probe card assembly according to claim 1 wherein the support substrate is a space transformer.

* * * * *